United States Patent
Fry et al.

(10) Patent No.: US 8,525,607 B2
(45) Date of Patent: Sep. 3, 2013

(54) CRYSTAL OSCILLATOR WITH REDUCED ACCELERATION SENSITIVITY

(75) Inventors: Steven Fry, Carlisle, PA (US); Wayne Bolton, Mechanicsburg, PA (US); John Esterline, Marysville, PA (US)

(73) Assignee: Greenray Industries, Inc., Mechanicsburg, PA (US)

( * ) Notice: Subject to any disclaimer, the term of this patent is extended or adjusted under 35 U.S.C. 154(b) by 7 days.

(21) Appl. No.: 13/474,361

(22) Filed: May 17, 2012

(65) Prior Publication Data

US 2012/0223785 A1 Sep. 6, 2012

Related U.S. Application Data

(63) Continuation of application No. 12/613,336, filed on Nov. 5, 2009, now Pat. No. 8,188,800.

(60) Provisional application No. 61/112,634, filed on Nov. 7, 2008.

(51) Int. Cl.
*H03B 5/32* (2006.01)
*H03L 1/02* (2006.01)
*H01L 41/08* (2006.01)

(52) U.S. Cl.
USPC ............ 331/162; 331/68; 331/69; 331/108 C; 331/116 R; 331/158; 310/348; 310/357; 310/360; 310/361

(58) Field of Classification Search
USPC ........... 310/311, 348, 357, 360, 361; 331/68, 331/69, 108 C, 108 D, 116 FE, 116 R, 154, 331/158, 162
See application file for complete search history.

(56) References Cited

U.S. PATENT DOCUMENTS

| | | | |
|---|---|---|---|
| 2,410,825 A | 3/1943 | Clarence | |
| 3,290,609 A | 1/1964 | Shreve | |
| 3,600,951 A | 8/1971 | Easton | |
| 3,614,485 A | 10/1971 | Cosman et al. | |
| 4,091,679 A | 5/1978 | Furusawa et al. | |
| 4,100,512 A | 7/1978 | Valdois et al. | |
| 4,219,754 A | 8/1980 | Hoshi et al. | |
| 4,317,059 A | 2/1982 | Besson | |
| 4,318,063 A | 3/1982 | Przyjemski | |
| 4,344,010 A | 8/1982 | Vig et al. | |

(Continued)

FOREIGN PATENT DOCUMENTS

| | | |
|---|---|---|
| GB | 2439606 | 1/2008 |
| WO | WO 2008000819 | 1/2008 |

OTHER PUBLICATIONS

Declaration of Steven J. Fry for U.S. Appl. No. 12/613,336. dated Sep. 28, 2011 in 12 pages.

(Continued)

*Primary Examiner* — Levi Gannon
(74) *Attorney, Agent, or Firm* — Knobbe, Martens, Olson & Bear, LLP

(57) ABSTRACT

A crystal oscillator having a plurality of quartz crystals that are manufactured so that the directional orientation of the acceleration sensitivity vector is essentially the same for each crystal. This enables convenient mounting of the crystals to a circuit assembly with consistent alignment of the acceleration vectors. The crystals are aligned with the acceleration vectors in an essentially anti-parallel relationship and can be coupled to the oscillator circuit in either a series or parallel arrangement. Mounting the crystals in this manner substantially cancels the acceleration sensitivity of the composite resonator and oscillator, rendering it less sensitive to vibrational forces and shock events.

20 Claims, 8 Drawing Sheets

(56) References Cited

U.S. PATENT DOCUMENTS

| | | | |
|---|---|---|---|
| 4,365,182 | A | 12/1982 | Ballato et al. |
| 4,384,495 | A | 5/1983 | Paros |
| 4,409,711 | A | 10/1983 | Ballato et al. |
| 4,410,822 | A | 10/1983 | Filler |
| 4,453,141 | A | 6/1984 | Rosati |
| 4,532,450 | A | 7/1985 | McNeel et al. |
| 4,575,690 | A | 3/1986 | Walls et al. |
| 4,588,969 | A | 5/1986 | Emmons |
| 4,802,371 | A | 2/1989 | Calderara et al. |
| 4,851,790 | A | 7/1989 | Driscoll |
| 4,871,986 | A | 10/1989 | Ballato |
| 4,891,611 | A | 1/1990 | Frerking |
| 4,902,926 | A | 2/1990 | Engel et al. |
| 5,022,130 | A | 6/1991 | EerNisse et al. |
| 5,041,754 | A | 8/1991 | Smythe |
| 5,109,176 | A | 4/1992 | Nguyen et al. |
| 5,117,696 | A | 6/1992 | Schmid |
| 5,153,476 | A | 10/1992 | Kosinski |
| 5,168,191 | A | 12/1992 | EerNisse et al. |
| 5,250,871 | A | 10/1993 | Driscoll et al. |
| 5,302,879 | A | 4/1994 | Totty et al. |
| 5,323,083 | A | 6/1994 | Smythe et al. |
| 5,512,864 | A | 4/1996 | Vig |
| 5,557,968 | A | 9/1996 | Krempl et al. |
| 5,608,360 | A | 3/1997 | Driscoll |
| 5,646,470 | A | 7/1997 | de Groot |
| 5,789,844 | A | 8/1998 | de Groot |
| 5,955,825 | A | 9/1999 | Uno |
| 6,031,317 | A | 2/2000 | Chen |
| 6,185,814 | B1 | 2/2001 | Okada |
| 6,288,478 | B1 | 9/2001 | Ishitoko et al. |
| 6,362,700 | B1 | 3/2002 | Fry |
| 6,532,817 | B1 | 3/2003 | Yukawa et al. |
| 6,544,331 | B1 | 4/2003 | Uno |
| 6,550,116 | B2 | 4/2003 | Nishihara et al. |
| 6,751,832 | B2 | 6/2004 | Hirota et al. |
| 6,777,613 | B2 | 8/2004 | Okazaki |
| 6,831,525 | B1 | 12/2004 | Beaudin et al. |
| 6,925,693 | B2 | 8/2005 | Takeuchi et al. |
| 6,984,925 | B2 | 1/2006 | Morley et al. |
| 7,046,584 | B2 | 5/2006 | Sorrells et al. |
| 7,051,728 | B2 | 5/2006 | Branham |
| 7,067,964 | B1 | 6/2006 | Kosinski |
| 7,106,143 | B2 | 9/2006 | Bloch |
| 7,240,410 | B2 | 7/2007 | Yamada et al. |
| 7,247,978 | B2 | 7/2007 | Robinson |
| 7,365,619 | B2 | 4/2008 | Aigner et al. |
| 7,397,165 | B1 | 7/2008 | Kosinski |
| 7,915,965 | B2 | 3/2011 | Hardy et al. |
| 2002/0017014 | A1 | 2/2002 | Takeuchi et al. |
| 2002/0021059 | A1 | 2/2002 | Knowles et al. |
| 2004/0189154 | A1 | 9/2004 | Branham |
| 2005/0007887 | A1 | 1/2005 | Sorrells et al. |
| 2005/0242893 | A1 | 11/2005 | Bloch et al. |
| 2006/0070220 | A1 | 4/2006 | Kawashima |
| 2006/0272139 | A1 | 12/2006 | Kinoshita |
| 2008/0060181 | A1 | 3/2008 | Fazzio et al. |
| 2008/0229566 | A1 | 9/2008 | Saito |

OTHER PUBLICATIONS

Filler, R.L., "The Acceleration Sensitivity of Quartz Crystal Oscillators: A Review", IEEE Transactions on Ultrasonics Ferroelectrics and Frequency Control, IEEE, US vol. 35, No. 3, May 1, 1988, pp. 297-305.

Fry, S.J., "Size Up Acceleration Sensitivity on XOs", Microwaves & RF, Oct. 1, 2004, http://www.mwrf.com/Articles/Print.cfm?ArticleID=8990, printed on Jan. 4, 2004 in 7 pages.

Fry, Steve J., "Acceleration Sensitivity Characteristics of Quartz Crystal Oscillators", Greenray Industries, Inc. Application Note, Jan. 2006 in 6 pages.

International Search Report and Written Opinion for Application No. PCT/US2009/063422, dated Jan. 15, 2010 in 22 pages.

CRYSTAL OSCILLATOR WITH REDUCED ACCELERATION SENSITIVITY

RELATED APPLICATIONS

This application is a continuation of U.S. patent application Ser. No. 12/613,336 filed Nov. 5, 2009, titled "CRYSTAL OSCILLATOR WITH REDUCED ACCELERATION SENSITIVITY", which claims benefit under 35 U.S.C. §119(e) to U.S. Provisional Patent Application No. 61/112,634, filed Nov. 7, 2008, entitled "CRYSTAL OSCILLATOR WITH REDUCED ACCELERATION SENSITIVITY", the entireties of which are hereby incorporated by reference herein and made a part of this specification.

BACKGROUND OF THE INVENTION

1. Field of the Invention

Embodiments of the invention relate generally to crystal oscillators and more specifically to crystal oscillators with reduced acceleration sensitivity.

2. Description of the Related Art

Quartz crystals are commonly used to control the frequency of electronic oscillators. Although quartz is one of the most stable materials available for fabricating a high frequency resonator, certain limitations can become apparent in precision applications. For instance, changes in the ambient temperature cause the resonant frequency to change. In addition, the natural frequency of a quartz resonator can also be affected by applied acceleration forces. In some situations, these effects on the frequency are relatively small and can go undetected (~0.0000002% per g of applied force). However, in many applications, an oscillator must operate in an environment which subjects it to levels of vibration or shock, where the resultant frequency shifts can be significant and can limit system performance. These deleterious effects are a well known problem and a major concern of oscillator designers.

Acceleration forces applied to a crystal oscillator assembly will cause a shift in the operating frequency. If these forces are in the form of periodic or sinusoidal vibration, frequency modulation will appear as sidebands to the carrier at the vibration frequency, the amplitude of which is determined by the amount of frequency shift. When the acceleration forces are in the form of random vibration, an increase in the broadband noise floor of the oscillator will occur. Either of these conditions may result in serious degradation of system performance in a noise sensitive application. Shock pulses due to handling or other environmental events can cause a jump in the frequency which may result in circuit malfunction such as loss of lock in phase locked loop or GPS tracking applications.

There are generally two classes of methods to minimize the effects of acceleration forces on crystal resonators. The first class is known as active compensation. In active compensation, an acceleration sensor is used to detect the characteristics of applied forces and a signal is then processed and fed back to the oscillator circuit to adjust the frequency by an equal magnitude but in the opposite direction from the acceleration induced shifts. This method can be effective over certain vibration frequency ranges, but it requires a relatively complex circuit and can be very expensive to implement.

The second class is referred to as passive compensation. Passive methods do not attempt to sense the applied acceleration. Generally, in passive methods, the crystal resonator or resonators are constructed using special methods that render them somewhat insensitive to acceleration forces. Passive methods can be effective, but they generally require an involved and difficult fabrication process to produce the required crystal or composite crystal assembly.

In view of these complications, one attempt has been to cancel acceleration sensitivity including determining a dominant sensitivity axis of the resonators and then mounting the resonators with the dominant sensitivity axes in an anti-parallel arrangement. However, in aligning the resonators according to a supposedly dominant axis, such methods do not take into account the sensitivities along the other axes. As a result, the exact maximum magnitude and direction of a crystal's acceleration sensitivity characteristic is not accounted for in such methods, and it is less effective in minimizing the effects of acceleration forces.

SUMMARY OF THE INVENTION

It is more effective to account for the magnitude and direction of the total acceleration sensitivity vector by summing or taking into account sensitivity in all three axes of the resonator. The acceleration sensitivity of a quartz crystal can be characterized as a vector quantity, commonly denoted as $\vec{\Gamma}$. The frequency shifts that are induced by external acceleration are therefore determined by both the magnitude and direction of the applied forces. The fractional frequency shift $\Delta f/f$ under an acceleration $\vec{a}$ is given by $$\frac{\Delta f}{f} = \vec{\Gamma} \cdot \vec{a}.$$

By measuring the components of $\Gamma$ in three mutually perpendicular directions which are perpendicular to the faces of the crystal or resonator package, it is possible to calculate the exact maximum magnitude and direction of the $\Gamma$ vector. Forces will have the most effect when they are imparted to the crystal in a direction that is parallel to this vector.

When two essentially identical crystals are aligned so that their vectors are in opposing directions or anti-parallel and coupled electrically in combination to the oscillator circuit, the vectors will cancel, rendering the composite resonator less sensitive to acceleration forces. Such an approach, however, has been difficult to achieve. Two crystals must be carefully matched and physically oriented so that the vectors are anti-parallel. Crystal resonators exhibit substantial variation in the direction and magnitude of the vector. The vector direction can vary as much as 60° even with resonators that have been identically manufactured. Measurements of many crystals have shown that the acceleration vector is not oriented relative to the crystallographic axes in any consistent manner even in identically designed and manufactured crystals. Based on these challenges, it has been necessary to physically manipulate the mounting orientation of the crystals to achieve the anti-parallel relationship. Vector inconsistency generally requires the use of complicated equipment such as an adjustable 3-axis gimbal mounting apparatus to individually align each crystal precisely as needed to achieve significant cancellation. Therefore, achieving vector cancellation involves a difficult and time consuming process of measuring, adjusting and mounting the crystals in an effective manner. Manufacturers have generally avoided this approach because it is so difficult and expensive. Embodiments of the present invention eliminate this burdensome process by configuring an oscillator with crystals that have been manufactured so that the direction of the $\Gamma$ vector points in a consistent and predictable direction in each crystal, the direction being relative to the normal mounting plane.

Embodiments of the present crystal oscillator include a plurality of crystals mounted with the acceleration sensitivity vectors in an essentially anti-parallel relationship. This helps to cancel the effects of acceleration or vibration on the output signal of the oscillator. Due to the vector nature of this characteristic, when the crystals are so aligned, cancellation of the acceleration effects will occur. Embodiments of this oscillator use crystals which have been manufactured so that the acceleration sensitivity vector points in a consistent and predictable direction relative to the mounting surface of the resonator.

In one embodiment, crystals are selected which have the same acceleration sensitivity vector magnitudes, within a certain tolerance. Complete cancellation of the sensitivity vectors can occur if the sensitivity vectors are of the exact same magnitude. However, significant cancellation can be achieved if the magnitudes of the sensitivity vectors differ.

The crystals are preferably contained in individual crystal packages or resonators. The crystals or resonators are then mounted to an oscillator circuit which is configured to sustain periodic oscillations. In one embodiment, the crystals are coupled in pairs so that the first crystal is inverted with respect to the second crystal. This inversion can be achieved by rotating the first crystal 180° around either the x axis in the y-z plane or around the y axis in the x-z plane. Because the crystals have been manufactured so that the direction of the vector is substantially the same for all crystals, the vectors can be aligned in an essentially anti-parallel manner without the need to measure and characterize the vector direction of each crystal and then manipulate the orientation of the mounting plane of the crystals. The crystals are preferably coupled in a way that allows them to function as a single composite resonator. This allows for the construction of an acceleration and vibration resistant crystal oscillator.

One embodiment of an oscillator comprises an electronic circuit configured to initiate and sustain periodic oscillations, a plurality of crystal resonators having acceleration sensitivity vectors aligned in a consistent and predictable relationship to the normal mounting plane of the resonator, wherein said crystal resonators are coupled to the electronic circuit such that the acceleration sensitivity vectors of at least two of the crystals are in an essentially anti-parallel relationship, and wherein said crystal resonators function as a single composite resonator controlling the frequency of oscillation. The oscillator can have crystal resonators electrically coupled in parallel or the oscillator can have crystal resonators electrically coupled in series. The crystal resonators can also be mechanically mounted by rotating at least one crystal resonator 180° around either the x or y axis.

Also, the resonators can be mounted such that said resonators are disposed on opposite sides of an oscillator substrate such that they may be coupled to the oscillator circuit by their normal mounting means. The resonators can be disposed side by side on the same surface of an oscillator substrate with the first resonator inverted 180° and mounted on its top with connections to the substrate. The oscillator can be configured such that the resonators are disposed back to back on the same surface of an oscillator substrate said resonators being mounted on their sides so that electrical connection to all of the electrodes may be made directly to the substrate.

An embodiment of the present invention also includes a method for improving the acceleration resistance of a quartz crystal controlled oscillator comprising (a) manufacturing a plurality of crystal resonators having acceleration sensitivity vectors that point in substantially the same direction relative to the mounting surface of the resonator, (b) determining the magnitude of the acceleration sensitivity component in the axis normal to the mounting plane of the crystal for all crystals in the group, (c) selecting a first crystal and a second crystal that exhibit acceleration sensitivity magnitudes that are substantially the same within a predetermined tolerance, (d) mounting the second said crystal such that its mounting plane is rotated 180° either around the x axis in the y-z plane or around the y axis in the x-z plane relative to the first crystal, aligning the two acceleration sensitivity vectors in a substantially anti-parallel arrangement, (e) coupling said crystal pair to the oscillator circuit so that the combination performs as a composite resonator to control the frequency of the oscillator.

DETAILED DESCRIPTION OF THE PREFERRED EMBODIMENTS

Figure 1:
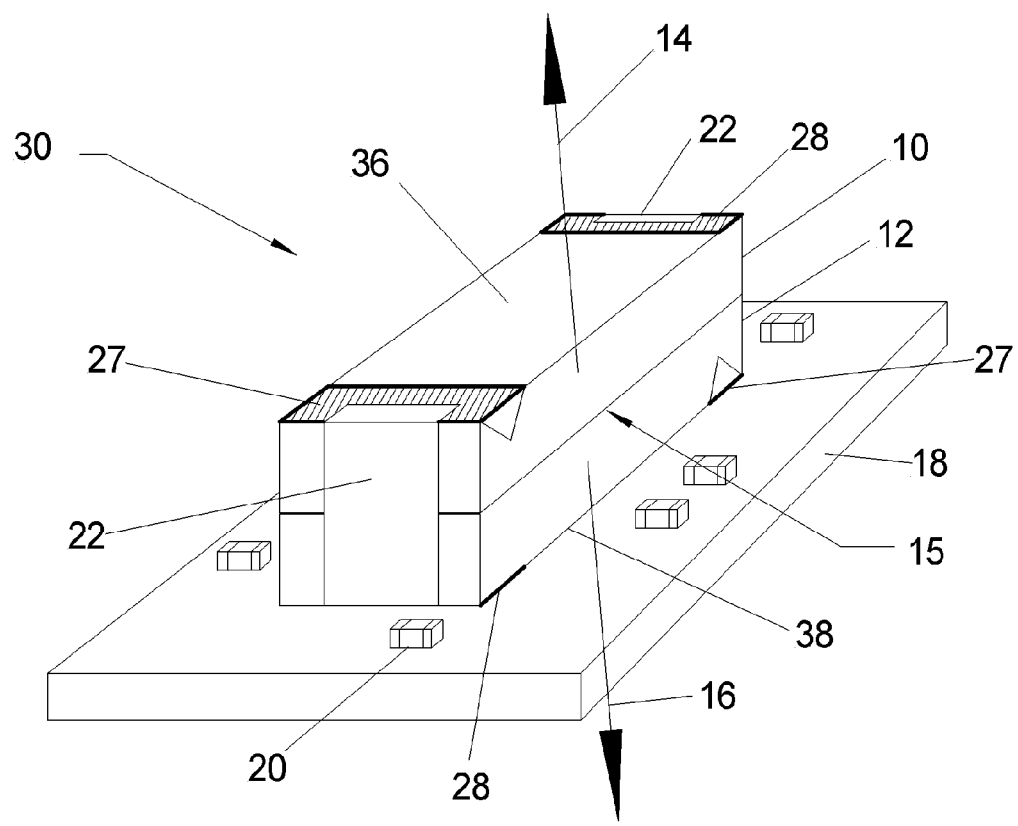
FIG. 1 illustrates a crystal oscillator assembly having a composite dual crystal resonator.

Referring now to FIG. 1, an embodiment of a crystal oscillator 30 can be configured with a composite dual crystal resonator in which the crystals are mounted with their normal mounting planes parallel to the surface plane of the circuit substrate 18. The oscillator 30 includes a first crystal resonator 10 and second crystal resonator 12 which are both electrically connected to the circuit with conducting jumpers 22 to form composite resonator 15. Preferably, the crystal resonators 10 and 12 have been manufactured so that their $\Gamma$ or acceleration sensitivity vectors 14 and 16 are pointing in the same direction relative to the normal mounting planes of the resonator packages 36 and 38. Therefore, when the first crystal 10 is inverted with relation to the second crystal 12 and mounted on top of it with the mounting planes parallel to each other, the acceleration sensitivity vectors 14 and 16 are essentially anti-parallel or pointing in opposing directions. While an arrangement with the acceleration sensitivity vectors exactly anti-parallel is preferred, vectors that are nearly anti-parallel may still provide the desired acceleration insensitivity. For instance, in some embodiments, the desired acceleration insensitivity benefits can be achieved where the acceleration vectors are within 5° off of anti-parallel. However, where the acceleration vectors are arranged more than 10° off of anti-parallel, the benefits can substantially diminish. Therefore, it is preferable that the acceleration vectors be within 10° of anti-parallel, and it more preferable that the vectors are within 5° of anti-parallel.

In one embodiment, the preferred crystal for the oscillator is a rectangular resonator strip crystal known as an "AT" cut crystal. This particular cut of crystal has a very low temperature coefficient with the inflection temperature near +25° C. so that frequency variations are minimized in most applications. The temperature characteristic of a quartz crystal is primarily determined by the angle that the resonator wafer is cut from a quartz bar relative to the crystal lattice. While the implementation of an anti-parallel cancellation technique is well suited to the AT cut, it may also be accomplished with any other family of cuts having an acceleration sensitivity in three axes.

Figure 8:
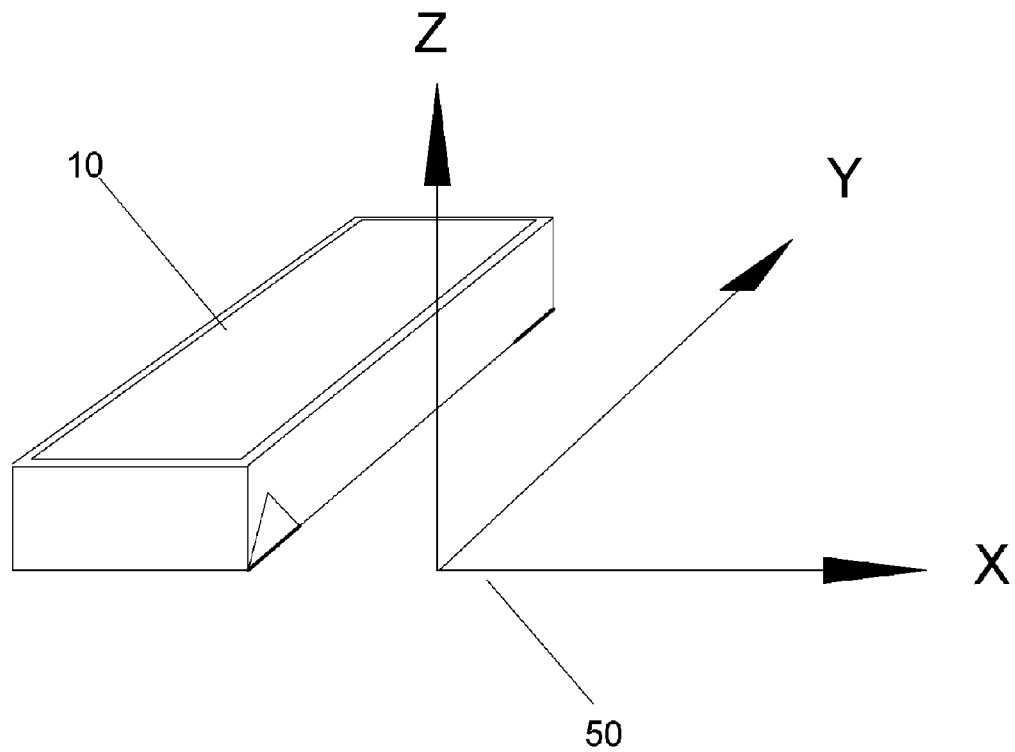
FIG. 8 illustrates the axis definitions of a single rectangular quartz crystal resonator.

The crystal resonators can be configured in an inverted position by rotating the first crystal 10 resonator 180° around either the x or y axis and directly mounting the first crystal on top of the second crystal 12. FIG. 8 illustrates an embodiment of a rectangular resonator 10 and a three axis coordinate system 50 which defines the axes relative to the faces of the resonator. The z axis ($\vec{z}$) points outward from the top of the package (a major face). The x axis ($\vec{x}$) points outward from the side (the long minor face). The y axis ($\vec{y}$) points outward from the end of the package (the short minor face).

The illustrated configuration effectively causes cancellation of the acceleration sensitivity of the composite resonator due to the vector nature of the crystal acceleration parameter. Crystal electrode pads 27 and 28 can be connected to the circuit with conducting jumpers 22 so that they can be operated either in parallel or series configuration in the oscillator circuit. The crystal oscillator 30 can also be configured to include a circuit substrate 18 supporting passive and active oscillator components 20.

Figure 2:
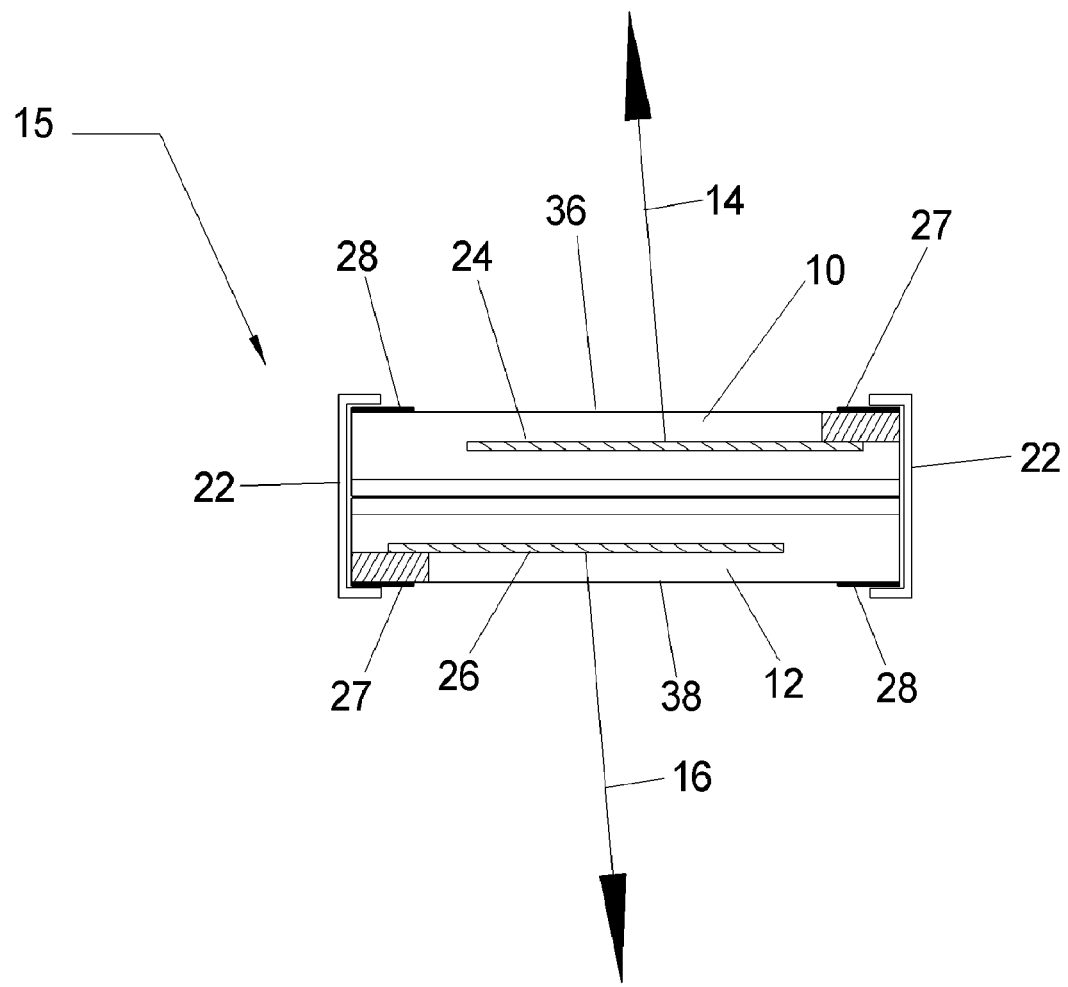
FIG. 2 illustrates a cross-sectional view of the composite resonator indicating the relative relationship of the crystal blanks and the mounting structure.

FIG. 2 shows a cross-sectional side view of an embodiment of a composite resonator 15 exposing the first internal quartz crystal blank 24 of first crystal resonator 10 and the second internal quartz crystal blank 26 of the second crystal resonator 12. Electrode pads 27 can be connected to the electrode deposited on of crystal blanks 24 and 26. Circuit traces within the crystal packages connect pads 28 to the electrode deposited on the other side of the crystal blanks 24 and 26. Preferably, the crystals are configured as part of a crystal resonator package which can include circuit traces, electrodes, the crystals, and other resonator materials. In constructing the composite resonator, first crystal resonator 10 can be rotated or inverted 180° and placed on top of the second crystal resonator 12. The first resonator 10 is preferably rotated 180° around the x or y axis, as shown in FIG. 8, so that planes 36 and 38 are mounted parallel to one another, and the acceleration sensitivity vectors 14 and 16 are aligned essentially anti-parallel. Although the vectors of the preferred embodiment are aligned exactly anti-parallel, other embodiments may have desired acceleration benefits where the vectors are aligned within 5° and 10° of anti-parallel. Conductive straps 22 can connect the electrode pads 27 and 28 of the first crystal resonator 10 to the electrode pads 27 and 28 of the second crystal resonator 12. The crystal resonators can also be coupled together using other means such as adhesive, use of the substrate, etc.

Figure 3:
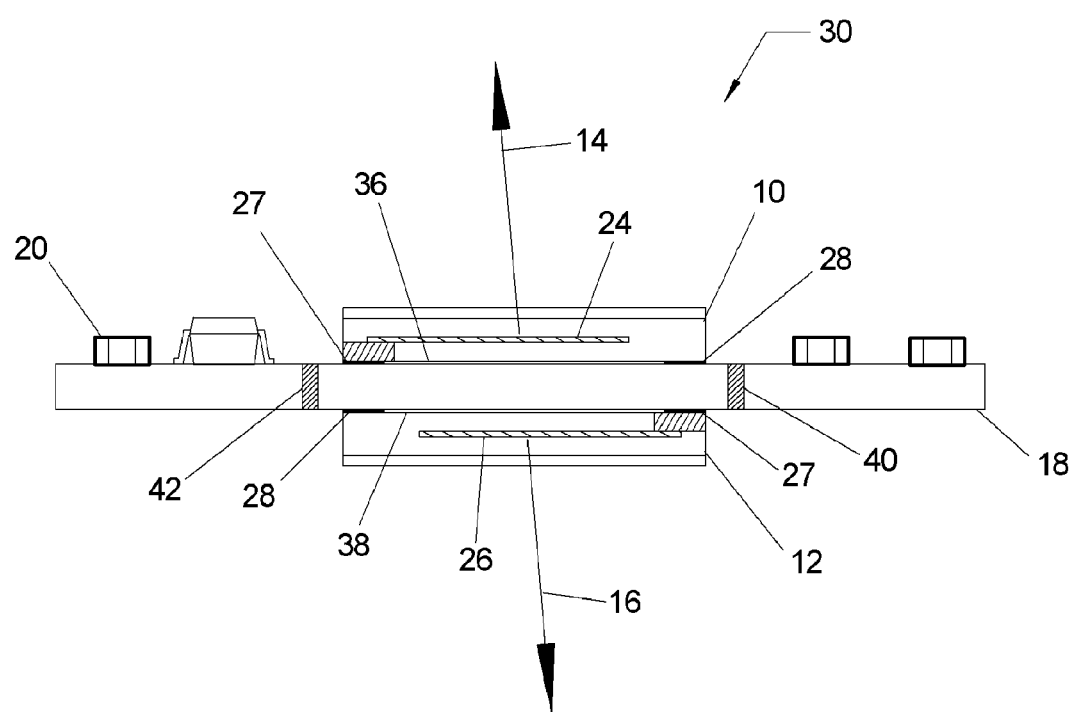
FIG. 3 illustrates a cross-sectional side view of an embodiment of the invention wherein the two matched crystals are mounted on opposite sides of an oscillator substrate.

FIG. 3 illustrates an embodiment of an oscillator wherein the matched crystal resonators 10 and 12 are disposed on opposite sides of an oscillator circuit substrate 18. In this manner, the crystal resonators 10 and 12 can each be attached to a substrate and circuit while maintaining the acceleration resistant positioning relative to one another. Preferably, the substrate has a uniform thickness so that the mounting plane of the first crystal 36 is parallel to the mounting plane of the second crystal 38. As the orientation of the first crystal has been inverted 180° around either the x or y axis, the acceleration sensitivity vectors 14 and 16 are essentially anti-parallel, pointing in opposite directions. Although the vectors of the preferred embodiment are aligned exactly anti-parallel, other embodiments may have the desired acceleration benefits where the vectors are aligned within roughly 5° and 10° of anti-parallel. The electrodes on crystal blanks 24 and 26 can be connected through the crystal package to the electrodes 27 and 28. The electrodes can then be connected together by conductive circuit board via the circuit elements 40 and 42 which complete the connection to the oscillator circuit either in a parallel or series configuration.

Figure 4:
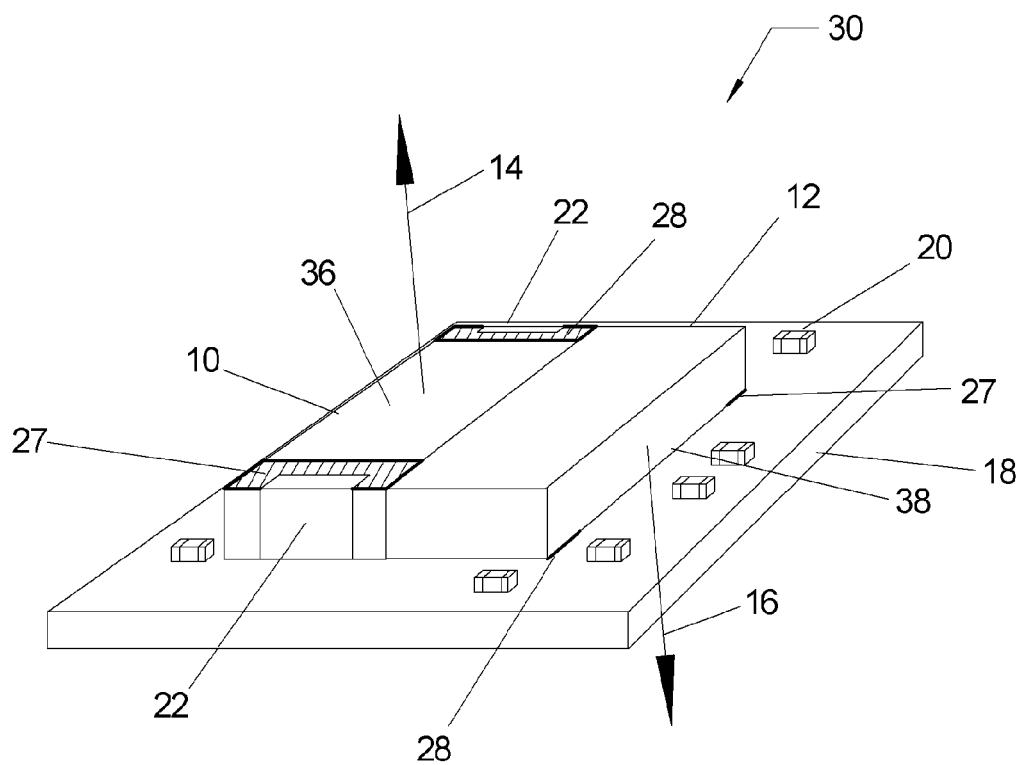
FIG. 4 illustrates an embodiment wherein the two matched crystals are mounted side by side on the same surface of the oscillator substrate.

FIG. 4 shows a further embodiment of an oscillator wherein two matched crystal resonators 10 and 12 are mounted side by side on the same surface of an oscillator substrate 18. Crystal resonator 10 is inverted or rotated 180° about the x or y axis and mounted on its top surface so that the mounting planes 36 and 38 are parallel and the acceleration sensitivity vectors 14 and 16 are essentially anti-parallel. Although the acceleration vectors of the preferred embodiment are aligned exactly anti-parallel, other embodiments may have desired acceleration benefits where the vectors are aligned within roughly 5° and 10° of anti-parallel. The crystal resonators 10 and 12 can be coupled directly to the substrate and can also be coupled to one another. Preferably, the crystal resonators have been manufactured so that the Γ vectors 14 and 16 are pointing in a consistent direction relative to the mounting surface of each crystal. The electrode pads 27 and 28 of the inverted crystal 10 can be connected to the oscillator substrate 18 with connecting jumpers 22.

Figure 5:
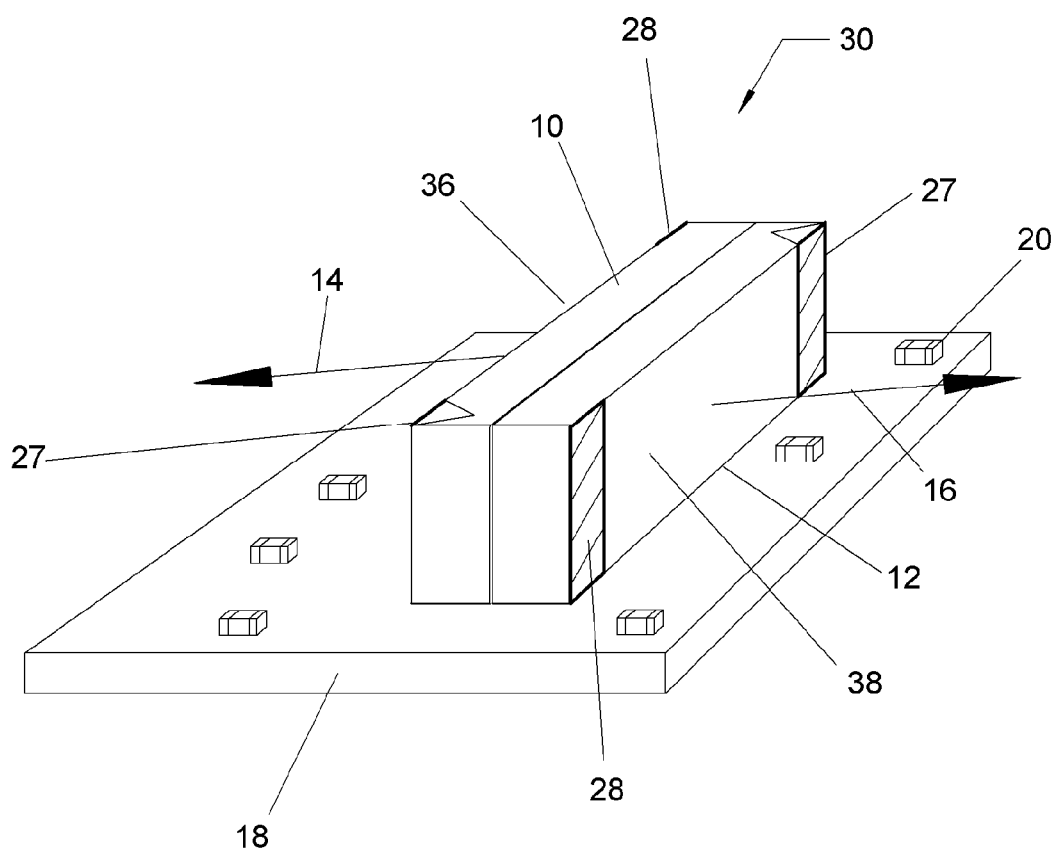
FIG. 5 illustrates a further embodiment of the oscillator wherein the two crystals are mounted on the oscillator substrate with the packages turned on their sides.

FIG. 5 shows a further embodiment of an oscillator wherein the two matched resonators 10 and 12 are mounted on their sides with their normal mounting surfaces 36 and 38 facing outward in opposite directions. This allows crystal pads 27 and 28 to be electrically connected to the oscillator substrate 18 directly without requiring additional connecting jumpers. Acceleration sensitivity vectors 14 and 16 are thereby aligned anti-parallel in the horizontal plane. While it is most beneficial for the Γ vectors to be aligned exactly anti-parallel, substantial acceleration benefits can be achieved if the vectors are aligned within 10° of anti-parallel. The crystal resonators 10 and 12 can be mounted to the substrate and can also be coupled to one another. The oscillator can also include active or passive elements 20 configured on the substrate 18.

Figure 6:
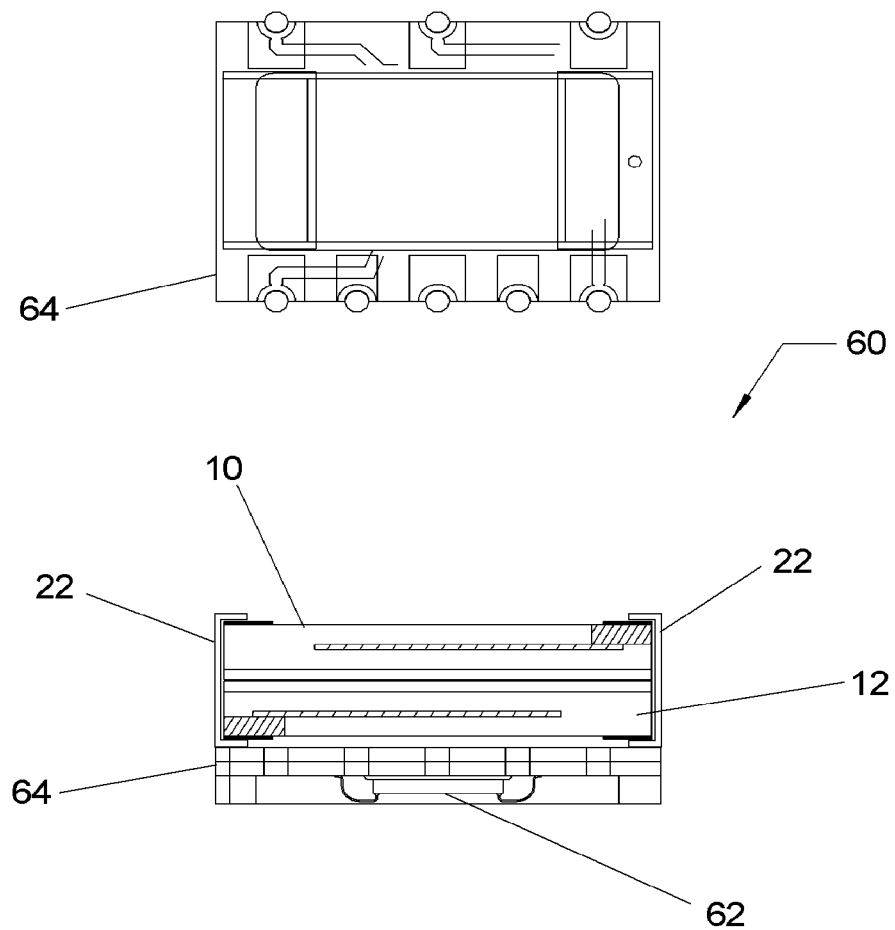
FIG. 6 illustrates an embodiment of an oscillator including a composite dual crystal resonator on a substrate containing the circuitry to implement a Temperature Compensated Crystal Oscillator (TCXO).

FIG. 6 illustrates an embodiment of an oscillator 60 wherein the two matched resonators 10 and 12 are mounted in an inverted position or back to back with the mounting plane of resonator 10 rotated 180° around the x axis in the y-z plane. The acceleration sensitivity vectors of the crystal resonators 10 and 12 are arranged essentially anti-parallel. While it is most beneficial for the Γ vectors to be aligned exactly anti-parallel, substantial acceleration benefits can be achieved if the vectors are aligned within 10° of anti-parallel. This composite resonator is disposed on an interconnecting substrate 64. Conductive straps 22 can connect the two resonators together and to the interconnecting substrate 64. A TCXO circuit 62 can also be mounted on the substrate 64 in order to produce a temperature compensated crystal oscillator 60. The TCXO circuitry 62 generates a correction signal to compensate and minimize the frequency drift of the resonator as the ambient temperature varies.

A TCXO with acceleration sensitivity vector cancellation based on embodiments of the invention has a g-sensitivity less than 0.05 parts-per-billion (ppb) or $5 \times 10^{-11}$ per g of applied acceleration force. This is at least an order of magnitude improvement compared to other TCXOs currently available. Also, when operating under random vibration, such a TCXO can improve the phase noise by more than 40 dB compared to conventional TCXOs. In an embodiment of an acceleration sensitivity cancelling TCXO, the frequency stability can be ±1 ppm over −40° to +70°. The input supply voltage can be +3.3 Vdc to +5 Vdc at 10 mA. Also, the low phase noise output can be CMOS compatible with 50/50±5% duty cycle. This can provide electronic frequency control for precise tuning or phase locking applications.

Figure 7:
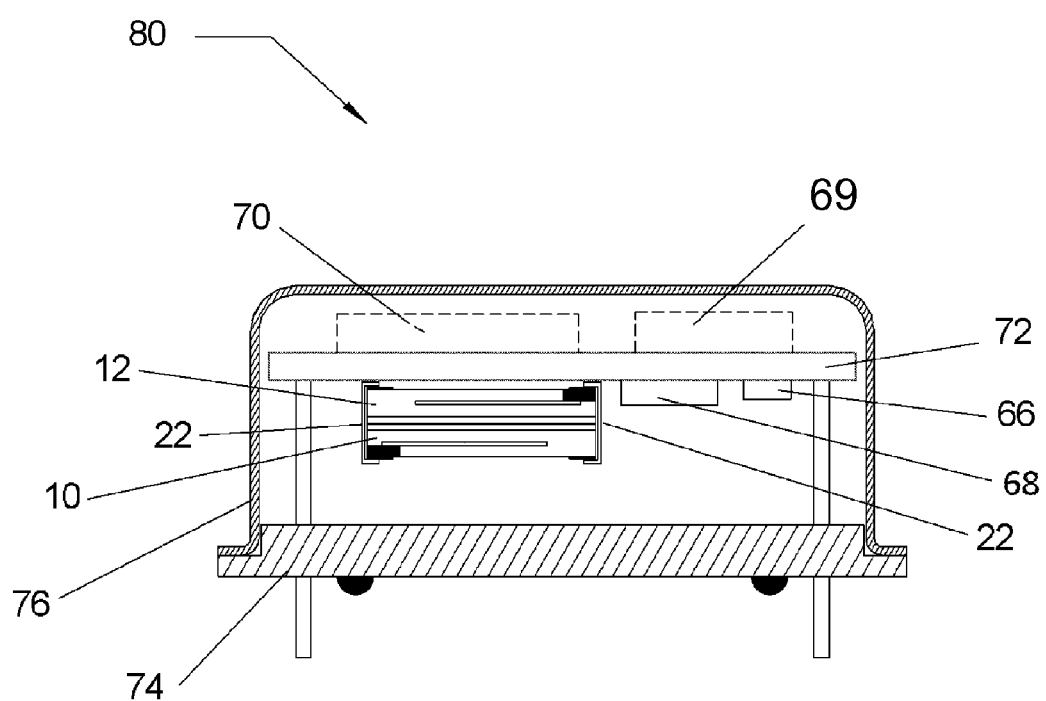
FIG. 7 illustrates an embodiment of an oscillator wherein the composite crystal resonator is included in an Oven Controlled Crystal Oscillator (OCXO).

FIG. 7 illustrates a further embodiment of an oscillator 80 wherein the two resonators 10 and 12 are mounted in an inverted or back to back position with the mounting plane of resonator 10 rotated 180° around the x axis in the y-z plane. The acceleration sensitivity vectors of the crystal resonators 10 and 12 are arranged essentially anti-parallel. While it is most beneficial for the Γ vectors to be aligned exactly anti-parallel, substantial acceleration benefits can be achieved if the vectors are aligned within 10° of anti-parallel. This composite resonator is then mounted to a planar oven substrate 72. On the substrate is also a heat source 68, temperature sensor 66, oscillator circuit 70 and oven control circuit 69 which proportionally controls and stabilizes the heat source 68 to maintain the resonators at a precise temperature even when the outside or ambient temperature varies. The oven controlled crystal oscillator is housed within a package consisting of supporting header 74 and cover 76. Therefore, the oscillator 80 is less sensitive to acceleration forces and is also oven controlled.

It should be pointed out that while what has been described here are several embodiments of the invention, it may be possible to implement various modifications and variations without departing from the intent and scope of the invention. Although the invention presented herein has been disclosed in the context of certain preferred embodiments and examples, it will be understood by those skilled in the art that the invention extends beyond the specifically disclosed embodiments to other alternative embodiments and/or uses of the invention and obvious modifications and equivalents thereof. Thus, it is intended that the scope of the invention herein disclosed should not be limited by the particular embodiments described above, but should be determined only by a fair reading of the claims.

What is claimed is:

1. An oscillator comprising:
an electronic circuit supported by a substrate and configured to initiate and sustain periodic oscillations;
at least two crystal resonators each having a mounting surface that is substantially planar having an x, y and z coordinate system relative to the mounting surface with the x-y plane parallel to the mounting surface, the crystal resonators each having a total acceleration sensitivity vector equaling a vector sum of component acceleration sensitivity in each of the x, y and z axes of the crystal resonator, wherein the total acceleration sensitivity vector of each crystal resonator comprises a magnitude and direction that are substantially the same, the vector pointing in substantially the same direction relative to the mounting surface;
a first crystal resonator and a second crystal resonator of the at least two crystal resonators, the first and second crystal resonators supported by the substrate and operatively coupled to the electronic circuit such that the mounting surfaces of the crystal resonators are parallel to each other, and the total acceleration sensitivity vector of each of the first and second crystal resonators are aligned within 5° of anti-parallel; and
wherein said first and second crystal resonators function as a single composite resonator to assist in controlling the frequency of oscillation.

2. The oscillator of claim 1, wherein the first and second crystal resonators each comprise a rectangular AT cut crystal blank having a major face that is substantially planar with a surface area, wherein the AT cut crystal blank is housed within a package, the package having a top face and a bottom face, wherein the bottom face is the mounting surface of the crystal resonator and the bottom face is substantially parallel to the major face of the AT cut crystal blank.

3. The oscillator of claim 1, further comprising a temperature compensation circuit coupled to the electronic circuit to minimize frequency drift of the oscillator from varying ambient temperature.

4. The oscillator of claim 1, further comprising an oven control circuit and a heat source, the oven control circuit and heat source coupled to the substrate such that the oven control circuit controls the heat source and maintains the temperature of the resonator.

5. The oscillator of claim 4, wherein the oscillator is in a housing comprising a supporting header and a cover.

6. The oscillator of claim 1, wherein the substrate has a top surface and a bottom surface, the first crystal resonator is supported on the top surface and the second crystal resonator is supported on the bottom surface of the substrate, such that the substrate is between the first and second crystal resonators.

7. The oscillator of claim 6, wherein the substrate has a substantially uniform thickness such that the top surface and bottom surface are essentially parallel, wherein the mounting surface of the first crystal resonator is supported by the top surface and the mounting surface of the second crystal resonator is supported on the bottom surface such that the mounting surface of the first and second crystal resonator are substantially parallel.

8. The oscillator of claim 1, wherein the first and second crystal resonators each comprise a crystal blank housed in a rectangular package with a planar surface, the planar surface is the mounting surface of the crystal resonator and has a length and a width, the width shorter than the length, wherein the first and second crystal resonators are positioned such that the z axis of the first and second crystal resonators are pointing in opposite directions, wherein the z axis points in a direction perpendicular to the mounting surface.

9. The oscillator of claim 8, wherein the x axis of the first and second crystal resonators are pointing in opposite directions, and the y axis of the first and second crystal resonators are pointing in the same direction, wherein the x axis points in a direction perpendicular to the length of the mounting surface, and the y axis points in a direction perpendicular to the width of the mounting surface.

10. The oscillator of claim 8, wherein the first and second crystal resonators each comprises at least one electrode pad connected to an electrode deposited on the crystal blank and connected to the electronic circuit on the substrate.

11. The oscillator of claim 10, wherein the rectangular package comprises at least one circuit trace, wherein the at least one circuit trace connects the at least one electrode pad to the electrode deposited on the crystal blank.

12. The oscillator of claim 10, wherein the at least one electrode pad of the first crystal resonator and the at least one electrode pad of the second crystal resonator are connected to the electronic circuit on the substrate to form the single composite resonator, wherein the electrode pads are connected to the electronic circuit with at least one conducting jumper.

13. The oscillator of claim 12, wherein the first and second crystal resonators of the single composite resonator are electrically coupled in either a parallel or series configuration.

14. The oscillator of claim 8, wherein the at least one electrode pad of the first crystal resonator and the at least one electrode pad of the second resonator are connected by conductive straps to form the single composite resonator.

15. An oscillator comprising:
   an electronic circuit supported by a substrate and configured to initiate and sustain periodic oscillations;
   at least two crystal resonators each having a mounting surface that is substantially planar having an x, y and z coordinate system relative to the mounting surface with the x-y plane parallel to the mounting surface, the crystal resonators each having a total acceleration sensitivity vector equaling a vector sum of component acceleration sensitivity in each of the x, y, and z axes of the crystal resonator, wherein the total acceleration sensitivity vector of each crystal resonator comprises a magnitude and direction that are substantially the same, the vector pointing in substantially the same direction relative to the mounting surface; and
   a first crystal resonator and a second crystal resonator of the at least two crystal resonators, the first and second crystal resonators supported by the substrate and operatively coupled to the electronic circuit such that the mounting surfaces of the crystal resonators are parallel to each other, and the total acceleration sensitivity vectors of each of the first and second crystal resonators are aligned within 5° of anti-parallel;
   wherein the first and second crystal resonators function as a single composite resonator having an acceleration sensitivity less than 0.05 ppb per g of applied acceleration force to assist in controlling the frequency of oscillation.

16. The oscillator of claim 15, wherein the first and second crystal resonators each comprise a rectangular AT cut crystal blank having a major face that is substantially planar with a surface area, wherein the AT cut crystal blank is housed within a package, the package having a top face and a bottom face, wherein the bottom face is the mounting surface of the crystal resonator and the bottom face is substantially parallel to the major face of the AT cut crystal blank.

17. The oscillator of claim 15, wherein the substrate has a top surface and a bottom surface, the first crystal resonator is supported on the top surface of the substrate and the second crystal resonator is supported on the bottom surface of the substrate, such that the substrate is between the first and second crystal resonators.

18. The oscillator of claim 15, wherein the first and second crystal resonators each comprise a crystal blank housed in a rectangular package with a substantially planar surface, the planar surface is the mounting surface of the crystal resonator having a length and a width, the width shorter than the length, wherein the first and second crystal resonators are positioned such that the z axis of the first and second crystal resonators are pointing in opposite directions, wherein the z axis points in a direction perpendicular to the mounting surface.

19. A method for improving the acceleration resistance of a quartz crystal controlled oscillator comprising:
   selecting a plurality of crystal resonators that each have a mounting surface that is substantially planar having a x, y and z coordinate system relative to the mounting surface, and a total acceleration sensitivity vector that points in substantially the same direction relative to the mounting surface, wherein the total acceleration sensitivity vector equals the vector sum of the acceleration sensitivity of the crystal resonator in the x, y and z axes, and comprises a magnitude and a direction;
   measuring the magnitude of the total acceleration sensitivity vector of each of the selected crystal resonators relative to a predetermined tolerance;
   pairing at least two crystal resonators, a first crystal resonator and a second crystal resonator, the total acceleration sensitivity vector of each of said at least two crystal resonators having a magnitude that is substantially the same within a predetermined tolerance;
   mounting the at least two crystal resonators such that the mounting surfaces of each of the crystal resonators are parallel, the total acceleration sensitivity vectors of the first and second crystal resonators are aligned within 5° of anti-parallel, and the at least two crystal resonators function as a single composite resonator having an acceleration sensitivity of less than 0.05 ppb per g of applied acceleration force to assist in controlling the frequency of oscillation;
   coupling the at least two crystal resonators to a substrate having an oscillator circuit; and
   operatively coupling the at least two crystal resonators to the oscillator circuit so that the combination performs to control frequency stability of the oscillator.

20. The method of claim 19, wherein mounting the at least two crystal resonators comprises:
   positioning the at least two crystal resonators so that the x, y and z axes of each crystal resonators are in the same direction relative to the mounting surface of the crystal resonators;
   rotating the first crystal resonator around the z axis so that the x and y axes of the at least two crystal resonators point in opposite directions; and
   rotating one of the at least two crystal resonators 180° around the y axis so that the mounting surface of the first crystal resonator faces the mounting surface of the second crystal resonator.

* * * * *